US008217481B2

(12) United States Patent
Nakai et al.

(10) Patent No.: US 8,217,481 B2
(45) Date of Patent: Jul. 10, 2012

(54) SOLID-STATE IMAGE CAPTURING DEVICE AND ELECTRONIC INFORMATION DEVICE

(75) Inventors: Junichi Nakai, Hiroshima (JP); Tomohiro Konishi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 184 days.

(21) Appl. No.: 12/420,104

(22) Filed: Apr. 8, 2009

(65) Prior Publication Data
US 2009/0256225 A1    Oct. 15, 2009

(30) Foreign Application Priority Data

Apr. 11, 2008    (JP) .................................. 2008-104138

(51) Int. Cl.
*H01L 31/0232*    (2006.01)
(52) U.S. Cl. .................. 257/432; 257/291; 257/E31.127
(58) Field of Classification Search .......... 257/291–292, 257/432–466, E31.001, E31.127
See application file for complete search history.

(56) References Cited

U.S. PATENT DOCUMENTS

| 5,479,049 | A | * | 12/1995 | Aoki et al. | 257/642 |
| 5,593,913 | A | * | 1/1997 | Aoki | 438/69 |
| 5,948,598 | A | * | 9/1999 | Shieh et al. | 430/311 |
| 6,188,094 | B1 | * | 2/2001 | Kochi et al. | 257/232 |
| 6,985,854 | B1 | * | 1/2006 | Mitsui | 704/220 |
| 2007/0243669 | A1 | * | 10/2007 | Suzuki et al. | 438/142 |

FOREIGN PATENT DOCUMENTS

| JP | 04-012568 | 1/1992 |
| JP | 11-040787 | 2/1999 |
| JP | 2004-079932 | 3/2004 |
| JP | 2005-174967 | 6/2005 |

* cited by examiner

*Primary Examiner* — Kiesha Bryant
*Assistant Examiner* — Tucker Wright
(74) *Attorney, Agent, or Firm* — David G. Conlin; Steven M. Jensen; Edwards Wildman Palmer LLP

(57) ABSTRACT

A solid-state image capturing device according to the present invention includes: a photoelectrical conversion section formed in a semiconductor substrate or in a substrate area provided on a substrate; a first transparent film provided on the photoelectrical conversion section; and a lens provided at a position above the first transparent film corresponding to the photoelectrical conversion section, where the lens is formed by using a second transparent film layered by changing a refractive index successively or incrementally, and at least one of top and bottom surfaces of the second transparent film is formed in a convex shape.

14 Claims, 9 Drawing Sheets

US 8,217,481 B2

SOLID-STATE IMAGE CAPTURING DEVICE AND ELECTRONIC INFORMATION DEVICE

This nonprovisional application claims priority under 35 U.S.C. §119(a) to Patent Application No. 2008-104138 filed in Japan on Apr. 11, 2008, the entire contents of which are hereby incorporated by reference.

BACKGROUND OF THE INVENTION

1. Field of the Invention

The present invention relates to a solid-state image capturing device comprising semiconductor elements for performing a photoelectric conversion on and capturing an image light from an object, a method for manufacturing the solid-state image capturing element, and an electronic information device, such as a digital camera (e.g., digital video camera and digital still camera), an image input camera, a scanner device, a digital copying machine, a facsimile machine and a camera-equipped cell phone device, having the solid-state image capturing device as an image input device used in an image capturing section of the electronic information device.

2. Description of the Related Art

The conventional solid-state image capturing device described above includes a CCD (Charge Coupled Device, electric charge coupling element) image sensor (referred to as CCD, hereinafter), and a CMOS (Complementary Metal Oxide Semiconductor) image sensor.

Such a solid-state image capturing device is used for various applications including a digital camera, a video camera, a camera-equipped cell phone device, a scanner device, a digital copying machine, and a facsimile machine. Further, as products using such a conventional solid-state image capturing device spread, the demand is increasing for decreasing the size and lowering the price of the solid-state image capturing device, in addition to higher functionality and higher performance of the increased number of pixels and increase on the light receiving sensitivity.

As such, when advancement for the solid-state image capturing device includes downsizing and a high pixel rate, while lowering of the price is requested, the pixel size is also reduced. Along with such a reduction of the pixel size, the light receiving sensitivity, one of the basic performances of the conventional solid-state image capturing device, is decreased, making it difficult to capture a clear image in a low luminous intensity environment. Therefore, it is a significant problem to be solved as to how the light receiving sensitivity can be improved per unit pixel.

Accordingly, Reference 1, for example, discloses a method for forming a microlens with an organic high molecule material on a color filter, as a method for improving the light receiving sensitivity of the solid-state image capturing device. In addition, References 2 and 3 disclose, in addition to a method for forming a microlens on a color filter, a method for forming what they call an inner-layer lens inside a laminated structure located below the color filter and in between a light receiving section and the color filter. According to Reference 2, an upwards convex shaped inner-layer lens is formed by transfer printing, whereas, according to Reference 3, a downwards convex shaped inner-layer lens is formed using a concave shaped well between a photoelectric conversion section and a transfer electrode. Herein, Reference 2 where an upwards convex shaped inner-layer lens is formed by transfer printing, will be described with reference to FIGS. 8 and 9(a) to 9(e).

FIG. 8 is a longitudinal cross sectional view schematically illustrating an exemplary essential structure of one pixel of a conventional CCD type solid-state image capturing device disclosed in Reference 2.

As illustrated in FIG. 8, a conventional CCD type solid-state image capturing device 20 includes impurity diffusion layers, such as a photoelectric conversion section 22 (light receiving section), a readout gate section 23, a CCD transfer channel 24, and a channel stopper 25, that constitutes each pixel, the impurity diffusion layers formed in a semiconductor substrate 21 under the front surface side thereof.

A transfer electrode 27 is formed above the readout gate section 23 and the CCD transfer channel 24 with an insulation film 26 interposed therebetween. The transfer electrode 27 has a function to read out a signal charge from the photoelectric conversion section 22 (light receiving section) to the CCD transfer channel 24, besides a function to transfer an electric charge in a predetermined direction. A light shielding film 29 is formed above the transfer electrode 27 with an inner-layer insulation film 28 interposed therebetween. The light shielding film 29 has an opening above the photoelectric conversion section 22 (light receiving section).

A first planarization film 30 formed of BPSG (Boro-Phospho-Silicate Glass) and the like is formed on the insulation film 26 and the light shielding film 29, and an inner-layer lens 31 formed of a silicon nitride film and the like is formed thereon. The inner-layer lens 31 is formed in such a manner to be disposed above the photoelectric conversion section 22. A second planarization film 32 is formed on the first planarization film 30 and the inner-layer lens 31, and its surface is planarized. On the second planarization film 32, a color filter 33, in which three primary colors of red, green and blue (R, G and B) are combined and arranged for every pixel, is formed. Further, a microlens 35 is formed above the color filter 33 with a protection film 34 interposed therebetween and in such a manner to be disposed above the photoelectric conversion section 22.

Herein, a method for manufacturing the conventional CCD type solid-state image capturing device 20 will be described in detail with reference to FIGS. 9(a) to 9(e).

FIGS. 9(a) to 9(e) are respectively longitudinal cross sectional view of essential parts for illustrating each manufacturing step up to the inner-layer lens forming step of the conventional CCD type solid-state image capturing device illustrated in FIG. 8.

First, as illustrated in FIG. 9(a) and as an impurity diffusion layer forming step, a predetermined impurity ion implantation is performed into the semiconductor substrate 21, and the photoelectric conversion section 22, readout gate section 23, CCD transfer channel (transfer section) 24, and channel stopper 25, are respectively formed.

Subsequently, the insulation film 26 is formed on the surface of the semiconductor substrate 21, and a film thickness of 300 nm, for example, of a transfer electrode material is layered thereon to form a predetermined pattern of the transfer electrode 27. The transfer electrode 27 is covered by the inner-layer insulation film 28, and a film thickness of 200 nm, for example, of the light shielding film 29 is formed in such a manner to have an opening above the photoelectric conversion section 22, with the inner-layer insulation film 28 interposed therebetween.

Next, as illustrated in FIG. 9(b) and as a first planarization step, a BPSG film, for example, is accumulated at the film thickness of about 600 nm on the light shielding film 29 and the insulation film 26 by the atmospheric pressure CVD method, the BPSG film being set at a predetermined phosphor concentration and a boron concentration, and the BPSG film is reflown under a high temperature of more than 900 degrees Celsius. As a result, the first planarization film 30 is formed.

Next, as illustrated in FIG. 9(c) and as an inner-layer lens forming step (first step: silicon nitride film filing step), a silicon nitride film 36 is layered at the film thickness of, for example, about 1200 nm by a plasma CVD method on the first planarization film 30.

Further, as illustrated in FIG. 9(d) and as the inner-layer lens forming step (second step: resist lens pattern forming step), a positive type resist is applied on the silicon nitride film 36 and a patterning is performed with the same lens shape in order to obtain a desired inner-layer lens 31. Subsequently, reflow is performed at more or less 160 degrees Celsius, for example, to form a resist pattern 37 having the lens shape on the silicon nitride film 36.

Subsequently, as illustrated in FIG. 9(e) and as the inner-layer lens forming step (third step: transferring step), dry etching is performed under a condition with strong anisotropy to transfer the lens shape of the resist pattern 37 into the silicon nitride film 36 in order to form the inner-layer lens 31.

Further, in order to improve the light focusing rate of the inner-layer lens 31, the second planarization film 32, which is formed of a material with a low refractive index, is formed in such a manner to cover the inner-layer lens 31 and the surface is planarized, as illustrated in FIG. 8. Subsequently, the color film 33, the protection film 34, and the microlens 35 are respectively formed to manufacture the conventional solid-state image capturing element 20 described above.

The layering of the silicon nitride film 36 has been described above; however, without the limitation to this, spattering can be performed under the condition of Ar: 100 sccm, $O_2$: 10 sccm as the gas type and its flow rate, with (Pb, La) (Zr, Ti) $O_3$ as a target so as to layer a PLZT film when the microlens 35 and the inner-layer lens 31 are formed using the refractive index variable material described above.

On the other hand, Reference 4 discloses a refractive index variable microlens that utilizes a characteristic to change the refractive index by applying a voltage (the Pockels effect) as another method for improving the light receiving sensitivity of a solid-state image capturing element.

When such a solid-state image capturing element is installed in a video camera and the like, the F value of the lens provided on the camera side is changed so as to obtain an appropriate exposure in accordance with image capturing conditions. Therefore, the light entering the solid-state image capturing element through the lens of the video camera changes its angle by the diaphragm of the video camera, and an oblique light enters as well as a parallel light.

Due to this, electrodes are provided at the top and bottom sections of the microlens and the inner-layer lens in order to constantly receive an incident light at the photoelectric conversion section in response to the diaphragm (the amount the lens is opened or closed) of the lens of the video camera. By applying a voltage to the microlens and the inner-layer lens, the refractive index of the microlens and the inner-layer lens can be arbitrarily changed.

In this case, a refractive index variable material layer (e.g., PLZT, $LiNbO_3$) formed of an electro-optics ceramics is used as the material for the microlens or the inner-layer lens. PLTZ is a piezoelectric material where a part of Pb is replaced with La in a lead zirconate titanate solid solution ($PbTiO_3.PbZrO_3$).

Reference 1: Japanese Patent No. 2945440
Reference 2: Japanese Laid-Open Publication No. 11-40787 (Japanese Patent No. 3809708)
Reference 3: Japanese Laid-Open Publication No. 11-87672
Reference 4: Japanese Laid-Open Publication No. 2001-60678

SUMMARY OF THE INVENTION

The conventional inner-layer lens described above, have problems illustrated in the below (1) and (2).

(1) As indicated in Reference 2, the refractive index of the inner-layer lens 31, which is formed of the silicon nitride film 36, is about 2.0. For example, when the oxygen content is increased at the layering of the silicon nitride film 36, it becomes a SiON film and the refractive index is lowered to about 1.5. On the contrary, when a camera is downsized, it is necessary to improve the light focusing rate (the rate of the amount of light entering the photoelectric conversion section 22 for incident light) as well as to shorten the distance between the upper-most surface of an image capturing element and the photoelectric conversion section 22 in order to correspond to a short pupil positional lens. However, as the high pixel rate advances for the image capturing element together with the downsizing, the pixel size is reduced even further, and the aspect ratio (b/a illustrated in FIG. 3) of the height of the light shielding film 29 with respect to the width of the photoelectric conversion section 22 (light receiving section) becomes even larger. In order to increase the incident light amount to the photoelectric conversion section 22 (light receiving section), it is indispensably necessary to improve the light focusing rate of the microlens 35 and the inner-layer lens 31 together with the thinning of the microlens 35 and the color filter 33 formed on a chip surface. For the improvement of this light focusing rate, it is now at its limit merely by thinning the microlens 35 and the inner-layer lens 31 and improving the refractive index. The same applies to the case of Reference 3.

(2) As indicated in Reference 4 with regard to the refractive index variable microlens and the inner-layer lens formed by layering a refractive index variable material layer formed of an electro-optics ceramics, such as PLZT and $LiNbO_3$ by the spattering method, it is necessary to form transparent electrodes on the top and bottom of the lens and process the wiring for applying a voltage, which results in a problem of complicating the steps and increasing the manufacturing cost. In addition, when the refractive index variable microlens is installed in the solid-state image capturing device, the range in which the refractive index can be changed is about 2.2 to 2.6 under the condition where the translucency is maintained by the voltage application and a mechanical strain does not occur. Further, although the refractive index of the overall microlens and inner-layer lens is changed by the voltage application, the improvement on the light focusing rate cannot be expected with respect to the increase on the aspect ratio due to the reduction of the pixel size described in the above (1). Therefore, instead of changing the refractive index of the lens every time in accordance with the diaphragm of the camera lens, it is more advantageous, in terms of the performance and the cost, to design the thickness, shape and refractive index of a microlens and inner-layer lens for each use of the camera and to manufacture a microlens and inner-layer lens suitable for such use.

The present invention is intended to solve the conventional problems described above. The objective of the present invention is to provide a solid-state image capturing device that is capable of improving the light focusing rate of the microlens and inner-layer lens in response to the required performance of the device, a method for manufacturing the solid-state image capturing device, and an electronic information device, such as a camera-equipped cell phone device, having the solid-state image capturing device as an image input device in an image capturing section thereof.

A solid-state image capturing device according to the present invention includes pixels, wherein each pixel of the solid-state image capturing device includes: a photoelectrical conversion section formed in a semiconductor substrate or in a substrate area provided in a substrate; a first transparent film provided on the photoelectrical conversion section; and a lens provided at a position above the first transparent film corresponding to the photoelectrical conversion section, wherein the lens is formed by using a second transparent film layered by changing a refractive index successively or incrementally, and at least one of top and bottom surfaces of the second transparent film is formed in a convex shape, thereby achieving the objective described above.

Preferably, in a solid-state image capturing device according to the present invention, the second transparent film is at least either of a metal compound and a silicon compound.

Still preferably, in a solid-state image capturing device according to the present invention, the second transparent film is formed by controlling a chemical composition like silicon oxide, silicon oxynitride and silicon nitride and by changing a refractive index inside the film successively or incrementally.

Still preferably, in a solid-state image capturing device according to the present invention, the second transparent film is formed such that the refractive index either increases or decreases successively or incrementally from a bottom surface to a top surface of the photoelectrical conversion section side.

Still preferably, in a solid-state image capturing device according to the present invention, the refractive index of the second transparent film is changed within the range of 1.4 to 2.2.

Still preferably, in a solid-state image capturing device according to the present invention, the first transparent film includes a concave portion on the top surface thereof, which is due to a concave portion above the photoelectrical conversion section, and the second transparent film is embedded into the concave portion of the top surface as the lens and the bottom surface of the second transparent film is formed downwardly convex.

Still preferably, in a solid-state image capturing device according to the present invention, agate electrode for transferring a signal charge from the photoelectrical conversion section is provided in the semiconductor substrate or in the semiconductor area provided on the substrate in which the photoelectrical conversion section is formed; a concave portion is formed in the first transparent film above the photoelectrical conversion section, due to a difference in level between the gate electrode and the photoelectrical conversion section; and the second transparent film is embedded into the concave portion of the first transparent film as the lens and the bottom surface of the second transparent film is formed downwardly convex.

Still preferably, in a solid-state image capturing device according to the present invention, the second transparent film is layered by changing the refractive index successively or incrementally inside the film together with the convex portion, and an upwardly convex lens is formed on a position on the first transparent film corresponding to the photoelectrical conversion section.

Still preferably, in a solid-state image capturing device according to the present invention, a third transparent film, which has a refractive index lower than that of the second transparent film, is formed on the second transparent film.

Still preferably, in a solid-state image capturing device according to the present invention, the second transparent film is set to have a refractive index higher than that of the first transparent film.

Still preferably, in a solid-state image capturing device according to the present invention, another lens, which is different from the lens, is formed above the third transparent film in such a manner to correspond to the photoelectrical conversion section.

Still preferably, in a solid-state image capturing device according to the present invention, a color filter and a protection film are formed between the third transparent film and the another lens.

Still preferably, in a solid-state image capturing device according to the present invention, the lens is an inner-layer lens.

Still preferably, in a solid-state image capturing device according to the present invention, the solid-state image capturing device is a CCD solid-state image capturing device or a CMOS solid-state image capturing device.

A method for manufacturing a solid-state image capturing device according to the present invention includes: a gate electrode forming step of forming a gate electrode for transferring a signal charge from a photoelectrical conversion section on a semiconductor area provided in a semiconductor substrate or a substrate, wherein the photoelectrical conversion section for performing a photoelectric conversion on an image light from an object is formed on the semiconductor substrate or the substrate; a first transparent film layering step of layering a first transparent film on the photoelectrical conversion section and the gate electrode; and a lens forming step of layering a second transparent film, which has a refractive index different from that of the first transparent film, on the first transparent film by changing the refractive index successively or incrementally in the film to form a convex portion on at least one surface of the top and bottom surfaces of the second transparent film, at a position above the first transparent film that corresponds to the photoelectrical conversion section, thereby achieving the objective described above.

An electronic information device according to the present invention includes the solid-state image capturing device according to the present invention as an image input device in an image capturing section, thereby achieving the objective described above.

The functions of the present invention having the structures described above will be described hereinafter.

In the present invention, a lens is provided at a location on a first transparent film corresponding to the photoelectric conversion section. This lens is formed a second transparent film layered in such a manner to change the refractive index successively or incrementally inside the film, and at least one of the top or bottom surfaces of the second transparent film is formed in a convex shape. As a result, the refractive index of the lens is changed either successively or incrementally inside the film, and a light is focused gradually from a higher position, thereby improving the light focusing efficiency reaching the photoelectric conversion section. Therefore, it becomes possible to achieve a solid-state image capturing device comprising an inner-layer lens and a microlens thereon, which have a high quality and high performance having a desired optical characteristic in which the refractive index is designed in accordance with a required performance of the device.

According to the present invention with the structure described above, in the field of a solid-state image capturing device including, for example, an inner-layer lens and a microlens thereon as the lenses, a first transparent film is formed on a semiconductor substrate (or semiconductor area)

having at least a photoelectric conversion section formed therein, a second transparent film having a refractive index different from that of the first transparent film is formed by changing its refractive index successively or incrementally inside the film, and a convex shape is formed on at least one of the top and bottom surfaces of the second transparent film at a location on the first transparent film corresponding to the photoelectric conversion section. As a result, it becomes possible to obtain a solid-state image capturing device comprising an inner-layer lens and a microlens thereon, which have a high quality and high performance having a desired optical characteristic in which the refractive index is designed in accordance with a required performance of the device.

These and other advantages of the present invention will become apparent to those skilled in the art upon reading and understanding the following detailed description with reference to the accompanying figures.

| | |
|---|---|
| 1 | semiconductor substrate |
| 2 | photoelectric conversion section |
| 3 | readout gate section |
| 4 | CCD transfer channel |
| 5 | channel stopper |
| 6 | insulation film |

-continued

| | |
|---|---|
| 7 | transfer electrode |
| 8 | interlayer insulation film |
| 9 | light shielding film |
| 10, 10B | first transparent film |
| 10A | first planarization film |
| 11A, 11B | inner-layer lens |
| 12 | second planarization film (third transparent film) |
| 13 | color filter |
| 14 | protection film |
| 15 | microlens |
| 16 | second transparent film |
| 16a | lens shape portion |
| 17 | resist pattern |
| 18 | inner-layer lens |
| 18a | planarization portion of inner-layer lens |
| 19, 19a | inner-layer lens |
| 20A, 20B, 20C, 20D | solid-state image capturing device |
| 90 | electronic information device |
| 91 | solid-state image capturing apparatus |
| 92 | memory section |
| 93 | display section |
| 94 | communication section |
| 95 | image output section |

DESCRIPTION OF THE PREFERRED EMBODIMENTS

Hereinafter, a case where an inner-layer lens is formed using a concave well between a photoelectric conversion section and a transfer electrode will be described as Embodiment 1 of a solid-state image capturing device according to the present invention and a method for manufacturing thereof; a case where an inner-layer lens is formed by transfer printing will be described as Embodiment 2 of a solid-state image capturing device according to the present invention and a method for manufacturing thereof; and further, Embodiment 3 of an electronic information device, such as a camera-equipped cell phone device, having the solid-state image capturing device according to Embodiments 1 and 2 as an image input device used in an image capturing section of the electronic information device, will be described.

Embodiment 1

Figure 1:
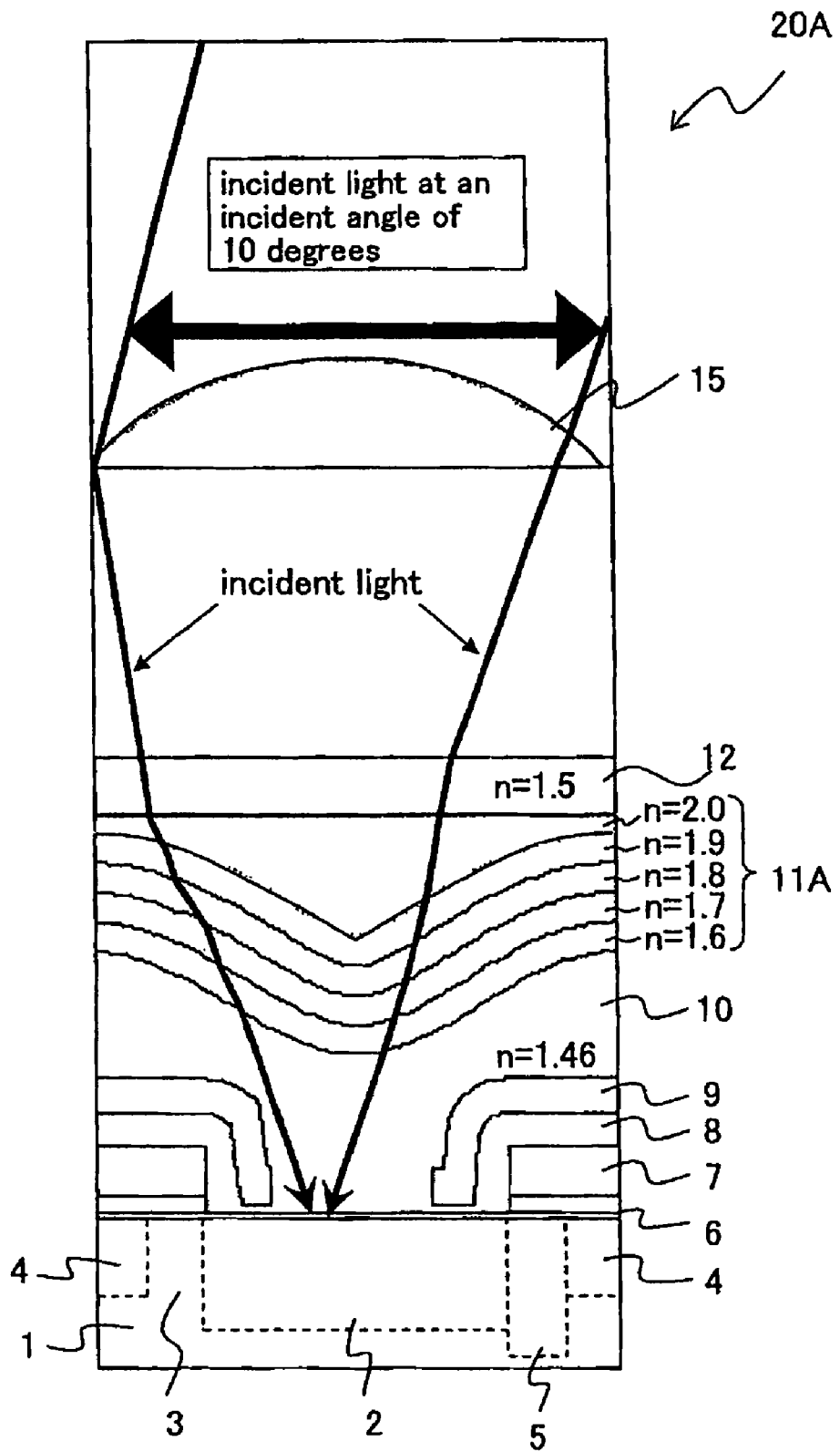
FIG. 1 is an essential part longitudinal cross sectional view of one pixel schematically illustrating a light focusing simulation result of a solid-state image capturing device according to Embodiment 1 of the present invention.

FIG. 1 is an essential part longitudinal cross sectional view of one pixel schematically illustrating a light focusing simulation result of a solid-state image capturing device according to Embodiment 1 of the present invention.

In FIG. 1, a solid-state image capturing device 20A according to Embodiment 1 is provided with impurity diffusion layers, such as a photoelectric conversion section 2, a readout gate section 3 next to it, a CCD transfer channel 4 next to it, and a channel stopper 5 next to it, for each unit pixel on a surface side of a semiconductor substrate 1. A transfer electrode 7 is formed above the readout gate section 3 and the CCD transfer channel 4 with an insulation film 6 interposed therebetween. For example, in a case of a CCD, the transfer electrode 7 is formed above the semiconductor substrate 1 between the adjacent photoelectric conversion sections 2 with the insulation film 6 interposed therebetween. The transfer electrode 7 has a function to read out a signal charge from the photoelectric conversion section 2 (light receiving section) to the CCD transfer channel 4, besides a function to transfer an electric charge in a predetermined direction.

The photoelectric conversion section 2 includes, for example, a plurality of p-n junction diodes (photodiodes)

formed in a matrix on the surface side of the semiconductor substrate 1, and a light that enters the photoelectric conversion section 2 is converted into a signal charge. The signal charge photoelectrically converted at the photoelectric conversion section 2 is supplied to the CCD transfer channel 4 provided on one side of the photoelectric conversion section 2 via the readout gate section 3, and is finally transferred to an electric charge detection section (not shown) and detected as a voltage. The CCD transfer channel 4 provided on the other side of the photoelectric conversion section 2 is separated for every element by the channel stopper 5 provided between the photoelectric conversion section 2 and the CCD transfer channel 4.

A light shielding film 9 is provided above the transfer electrode 7 with an interlayer insulation film 8 interposed therebetween. The light shielding film 9 is provided for the purpose of preventing light from breaking through to the transfer section (CCD transfer channel 4), and an end section (outer circumference section) of the photoelectric conversion section 2 is also covered by the light shielding film 9. The light shielding film 9 has an opening (light entering opening) that is optically opened above the photoelectric conversion section 2 except for the end section of the photoelectric conversion section 2.

On the light shielding film 9 and the insulation film 6, a first transparent film 10, which is made with BPSG film, is layered in a concave shape above the photoelectric conversion section 2, a inner-layer lens 11A, which has a downwards convex shape and is constituted of a high refractive index second transparent film, is formed thereabove, in such a manner to be positioned above the photoelectric conversion section 2.

The inner-layer lens 11A is comprised of a plurality of layers (five layers herein) of the second transparent film, which are layered such that the refractive index is incrementally changed inside the film, in order to focus a light to the photoelectric conversion section 2, and the bottom surface of the inner-layer lens 11A is formed in a downwards convex shaped well by reflecting the difference in level between the transfer electrode 7 and light shielding film 9, and the photoelectric conversion section 2. The plurality of layers of the inner-layer lens 11A, which are constituted of the second transparent film, are formed such that the refractive index inside the film is incrementally increased within the range of 1.4 to 2.2 (1.6 to 2.0 herein) from the bottom surface to the top surface.

A planarization film 12 is provided as a third transparent film for planarizing a surface in such a manner to cover the inner-layer lens 11A. Further, a microlens 15 is provided thereabove for focusing a light to the photoelectric conversion section 2 with a color filter and a protection film (which are not shown) interposed therebetween.

Hereinafter, a method for manufacturing the solid-state image capturing device 20A with the structure described above will be described in detail.

First, impurity diffusion layers, such as the photoelectric conversion section 2 (light receiving section), the readout gate section 3, the CCD transfer channel 4, and the channel stopper 5, are formed in a front surface side of the semiconductor substrate 1. The semiconductor substrate 1 is not particularly limited as long as it is a substrate normally used for forming a semiconductor apparatus, and it is possible to use a substrate that is constituted, for example, of a semiconductor, such as silicon and germanium, and a compound semiconductor, such as SiC, GaAs, and AlGaAs. In particular, it is preferable to use a silicon substrate. Although the semiconductor substrate 1 is doped with an n-type or p-type impurity, it may further include one or more of n-type or p-type well areas. In addition, on the surface of the semiconductor substrate 1, an impurity diffusion area including a high concentration n-type or p-type impurity is formed as an element separation area and a contact area, besides the photoelectric conversion section 2 (light receiving section), the readout gate section 3, the electric transfer area (CCD transfer channel 4), and the channel stopper area (channel stopper 5). Further, other semiconductor elements and circuits may be combined to this structure.

As the photoelectric conversion section 2, a p-n junction diode (light receiving section; photodiode) formed on the surface of the semiconductor substrate 1 can be listed, for example. According to the p-n junction diode, the size, shape, and number of the p-type or n-type impurity, the impurity concentration of the impurity layer, and the like, which are formed on the surface side of the semiconductor substrate 1, can be set as needed in accordance with the performance of the required semiconductor apparatus. As a method for forming the photoelectric conversion section 2 on the surface side of the semiconductor substrate 1, a method is listed, for example, in which a photomask having an opening is formed in a desired area of the semiconductor substrate 1 by photolithography and etching steps and ion implantation is performed with impurity ion into the semiconductor substrate 1 using this photomask.

Next, the transfer electrode 7 is formed above the readout gate section 3 and the CCD transfer channel 4 with the insulation film 6 interposed therebetween. The material for the transfer electrode 7 is not particularly limited as long as it is a material used for an electrode, and polycrystalline silicon, tungsten silicide, aluminum, and the like can be listed, for example. The film thickness of the transfer electrode is not particularly limited, and the thickness of about 300 to 600 nm can be listed, for example.

Next, a predetermined shape of the light shielding film 9 is formed, which is opened above the photoelectric conversion section 2, above the transfer electrode 7 with the interlayer insulation film 9 interposed therebetween. The light shielding film 9 is not particularly limited as long as its material and film thickness can substantially and completely shield the visible light and/or infrared rays; and a metal film and alloy film, such as tungsten silicide and titanium tungsten, of the film thickness of about 100 to 1000 nm can be listed. In addition, the interlayer insulation film 8 is not particularly limited as long as it is formed of a normally used material; and for example, a plasma TEOS (Tetra-Ethoxy Silane) film, an LTO (Low temperature Oxide) film, an HTO (High Temperature Oxide) film, and an NSG (None-Doped Silicate Glass) film by the CVD (Chemical Vapor Deposition) method, an SOG (Spin On Glass) film applied and formed by the spin coat method, and a single layered film or laminated film of a silicon nitride film by the CVD method can be listed.

Subsequently, a first transparent film 10 is formed on the insulation film 6 and the light shielding film 9. The first transparent film 10 includes a concave portion on the top surface above the photoelectric conversion section 2 due to the difference in level (concave and convex shapes) between the transfer electrode 7 and light shielding film 9, and the photoelectric conversion section 2. It is preferred that the first transparent film 10 has a light transmissivity of about 80 to 100 percent depending on the material and the film thickness. A single layered film or a laminated film as illustrated as the insulation film 6 described above can be listed as a material of the first transparent film 10, and in particular, a BPSG film is preferable. The film thickness is, for example, about 100 to 2000 nm. Further, the concave shape and its depth on the top surface of the first transparent film 10 is one of the conditions that determine the thickness and the shape of the bottom surface convex portion of the inner-layer lens 11A since the shape of the inner-layer lens 11A formed on the concave shape of the first transparent film 10 is a downwardly convex shape. Therefore, it is preferable to appropriately adjust the bottom surface convex portion of the inner-layer lens 11A by adjusting the concave shape and the depth of the top surface of the first transparent film 10.

These transfer electrode 7, interlayer insulation film 8, light shielding film 9 and the first transparent film 10 can be formed by selecting a method used in the field, such as the spattering method; various CVD methods including, decompression CVD method, atmospheric pressure CVD method and plasma CVD method; the spin coat method; the vacuum plating method, and the EB method.

The second transparent film with the plurality of layers that constitute the inner-layer lens 11A can also be formed by the aforementioned various methods as similar to the first transparent film 10 described above; however, the method for forming the film will be described using the CVD method as an example herein.

Above the photoelectric conversion section 2, the first transparent film 10 includes a concave portion on the top surface, which is due to the roughness (concave and convex) on the base surface. In this case, a convex portion is formed on the bottom surface of the second transparent film that is formed on the first transparent film 10, and the downwards convex shaped inner-layer lens 11A is formed. Further, as needed, a convex portion is processed and formed on the top surface of the second transparent film by, the dry etching method, for example. As a result, an upwards convex shaped inner-layer lens can be formed above the photoelectric conversion section 2. Thus, the second transparent film that constitutes the inner-layer film can also form a convex portion on both of the top and bottom surfaces.

The plurality of layers of the second transparent film that constitute the inner-layer lens 11A are defined to be five layers in which the refractive index changes from the bottom consecutively from 1.6 to 2.0. As the material for the second transparent film, the refractive index is higher than that of the first transparent film 10, and a metal compound and silicon compound can be listed such as $TiO_2$ (refractive index of 2.5), $TaO_2$ (refractive index of 2.2), $ZrO_2$ (refractive index of 2.2), $Si_3N_4$ (refractive index of 2.0), SiON ((refractive index of 1.8), and $SiO_2$ (refractive index of 1.5). The refractive index of these metal compound and silicon compound can be incrementally (laminated structure) changeable within a predetermined range by adjusting the type, composition, flow rate of the reaction gas to be used, and further, the temperature and pressure at the layering, when formed by the CVD method, for example.

That is, as an example of layering the second transparent film, $SiO_2$ with the refractive index of 1.5 is formed by using $O_2$ and $SiH_4$ as the reaction gas. During the layering, an appropriate amount of $NH_3$ gas is added and simultaneously $O_2$ gas is reduced to form a SiON (refractive index of 1.8) film is formed. Subsequently, the $O_2$ gas is further reduced and $NH_3$ gas is further increased so that the film composition approaches $Si_3N_4$ (refractive index of 2.0) unlimitedly. By using such a method, it is possible to form the second transparent film including a film composition with the top surface of the $Si_3N_4$ film with the refractive index of 2.0, changing incrementally towards the bottom surface into SiON with the refractive index of 1.8, and the lower-most bottom surface that approaches $SiO_2$ with the refractive index of 1.5. Therefore, the plurality of layers of the second transparent film that constitute the inner-layer lens 11A can be a five layered laminated structure in which the refractive index consecutively changes in a stepping manner from 1.6 to 2.0 starting from the bottom.

In addition, the planarization film 12, which functions as the third transparent film and is constituted of a transparent and low-refractive-index material, on the inner-layer lens 11A that is constituted of the second transparent film, in such a manner to cover the surface of the inner-layer lens 11A with an even film thickness. As the material for the third transparent film, a material with a refractive index lower by 0.5 than the refractive index of the surface of the high refractive index material film, which constitutes the second transparent film, can be listed (refractive index of 1.5). The planarization film 12 of the third transparent film can be formed as a single layered film or a laminated film by the spattering method and the CVD method. In addition, an organic resin can be used for the planarization film 12; and an organic resin with the refractive index smaller than about 1.6 in the visible light area can be listed, for example. Specifically, a mixture of one or two kinds of a fluoro-olefin copolymer, a polymer having fluorine-containing aliphatic ring structure, perfluoroalkyl ether copolymer, and a fluorine-containing acrylate (methacrylate) polymer can be listed. Further, a fluoride, more particularly magnesium fluoride ($MgF_2$), and the like may be added to these polymers.

Further, the microlens 15 is formed above the inner-layer lens 11A with the planarization film 12 of the third transparent film interposed therebetween. In addition, although not shown, one or more kinds of films, which functions as a color filter, a passivation film, a protection film, a planarization film, an interlayer film, may be formed in between the planarization film 12 of the third transparent film and the microlens 15, with any material and with any film thickness. For example, although not shown, the microlens 15 can be formed on the planarization film 12 with a color filter and further a protection film interposed therebetween. As the shape of the microlens 15, the bottom is planarized by the planarization film 12 of the third transparent film, the passivation film, the protection film, the planarization film, the interlayer film and the like, which are in lower layers, and the microlens 15 is processed as an upwardly convex, arch-type lens shape.

In Embodiment 1, a case has been described where the plurality of layers of the second transparent film are layered (five layers herein) such that the refractive index of the second transparent film that constitutes the inner-layer lens 11A increases incrementally (laminated structure) from the bottom surface to the top surface; however, without the limitation to this, it is possible to film the second transparent film such that the refractive index of the second transparent film, which constitutes the inner-layer lens 11A, successively increases from the bottom surface to the top surface. In this case, the refractive index of the metal compound and silicon compound that constitute the second transparent film can be successively changeable within a certain range by adjusting the type, composition, flow rate of the reaction gas to be used, and further, the temperature and pressure at the layering when the second transparent film is formed by the CVD method, for example. That is, as an example of layering the second transparent film, $SiO_2$ with the refractive index of 1.5 is formed by using $O_2$ and $SiH_4$ as the reaction gas. During the layering, an appropriate amount of $NH_3$ gas is added and simultaneously $O_2$ gas is reduced to form a SiON (refractive index of 1.8) film is formed. Subsequently, the $O_2$ gas is further reduced and $NH_3$ gas is further increased so that the film composition approaches $Si_3N_4$ (refractive index of 2.0) unlimitedly. By using such a method, it is possible to form the second transparent film including a film composition with the top surface of the $Si_3N_4$ film with the refractive index of 2.0, changing incrementally towards the bottom surface into SiON with the refractive index of 1.8, and the bottom surface that approaches $SiO_2$ with the refractive index of 1.5. Therefore, the plurality of layers of the second transparent film that constitute the inner-layer lens 11A can be a laminated structure in which the refractive index consecutively changes in a stepping manner from 1.6 to 2.0 starting from the bottom.

Figure 2:
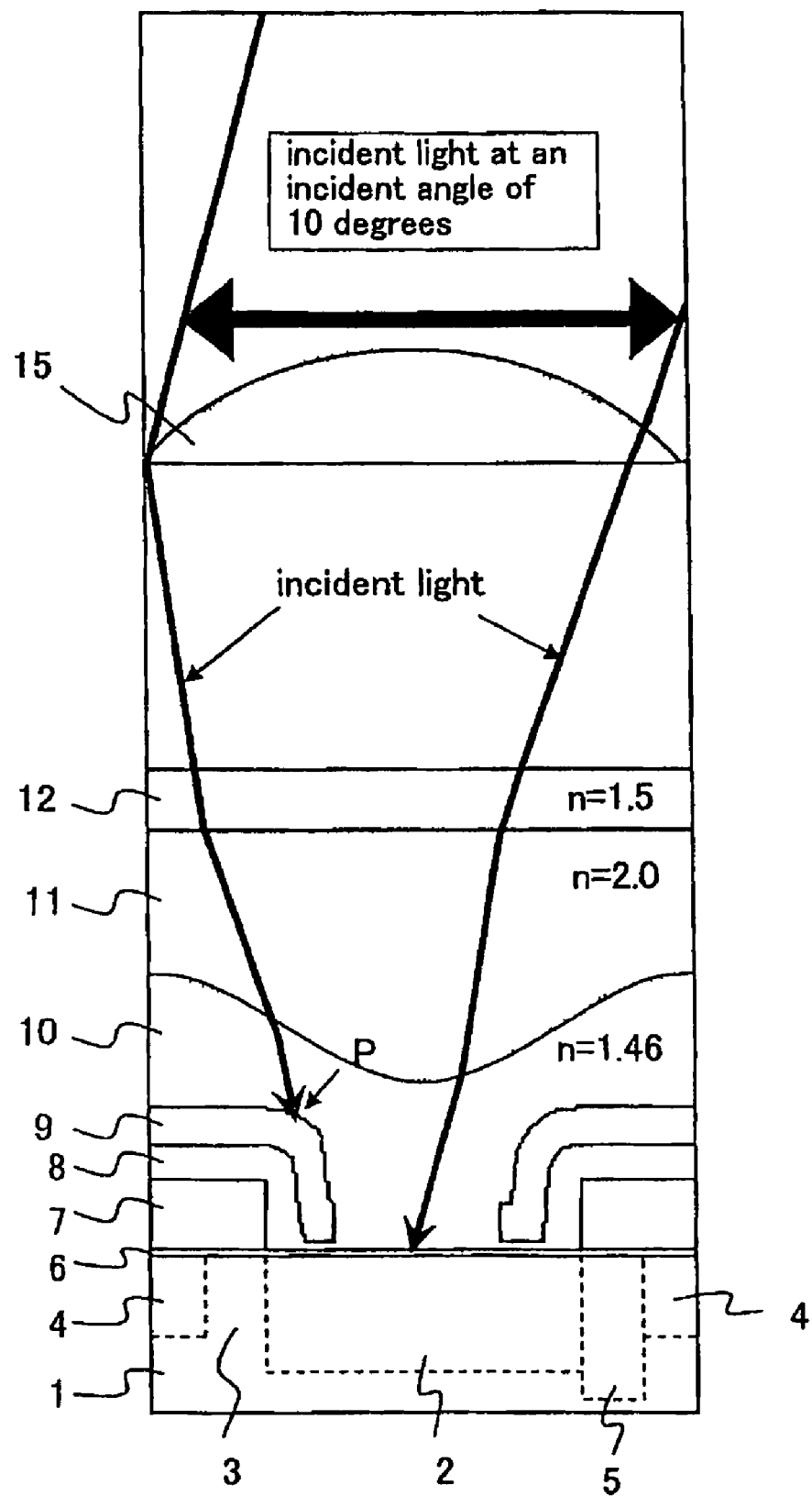
FIG. 2 is an essential part longitudinal cross sectional view of one pixel schematically illustrating a light focusing simulation result of a conventional solid-state image capturing device.

Herein, as the function and effect of Embodiment 1, a comparison result of a light focusing simulation will be described between the solid-state image capturing device 20A including the inner-layer lens 11A according to Embodiment 1 as illustrated in FIG. 1 and the solid-state image capturing device (FIG. 2) including an inner-layer lens 11, which is formed by a conventional method as illustrated in FIG. 2 and which does not change the refractive index inside the layer.

According to the conventional solid-state image capturing device illustrated in FIG. 2, the refractive index n changes from 1.5 to 2.0 and then 1.46 from the incident light entering side via the inner-layer lens 11 to the photoelectric conversion section 2 side; and the inner-layer lens 11 with a uniform refractive index is formed at the portion of 2.0 of the refractive index n. On the other hand, according to the solid-state image capturing device 20A of Embodiment 1 illustrated in FIG. 1, the refractive index changes from 1.5, 2.0, 1.9, 1.8, 1.7, 1.6 to 1.46 from the incident light entering side via the inner-layer lens 11A to the photoelectric conversion section 2 side; and the inner-layer lens 11A is formed with the refractive index changing in the portions with the refractive index from 2.0 to 1.6.

In particular, with respect to a light with a large incident angle, which becomes a problem in a case where a short pupil positional lens is used, the amount of light that should enter the photoelectric conversion section 2 decreases and the light focusing rate decreases in the conventional structure, due to the so-called "reflection of light" by the surface of the light shielding film 9 as illustrated in the "P" in FIG. 2. On the contrary, with the multilayered structure of the inner-layer lens 11A according to Embodiment 1, the refractive index is consecutively changed in the inner-layer lens 11A, so that the incident light starts to be refracted at the downwardly convex under surface, which is the upper-most layer (refractive index of 2.0) inside the inner-layer lens 11A and the light is gradually focused from the higher position. As a result, the reflection of light is decreased particularly for the obliquely-entering incident light, the decrease of the light focusing rate is small, and the light can be efficiently focused to the photoelectric conversion section 2.

Further describing the difference between Embodiment 1 and Cited References 1 and 2 described above, according to Cited Reference 2, the inner-layer lens is formed with a silicon nitride film, which has a relatively high refractive index (n=2.0) and is layered by the plasma CVD method. In this case, the refractive index in the inner-layer lens is uniform in the film and the refractive index cannot be changed inside the film, and therefore, it is not possible to obtain a desired refractive index in accordance with the required performance of the device as in aforementioned Embodiment 1.

In addition, according to Cited Reference 1 described above, a convex shaped lens is formed by thermal transformation using a photosensitive material (generally a photosensitive polymer such as photoresists), which is a basic technique for forming a lens for a solid-state image capturing device. In this case as well, the refractive index of the lens is uniform in the film and the refractive index cannot be changed, and therefore, it is not possible to obtain a desired refractive index in accordance with the required performance of the device as in aforementioned Embodiment 1.

Table 1 below is a comparative table of light focusing rates with respect to incident angles of the light, in which the light focusing rates are compared between the solid-state image capturing device 20A according to Embodiment 1 (FIG. 1) and the conventional solid-state image capturing device (FIG. 2) at the incident angle of 0 degrees (the light enters vertically with respect to the surface of the photoelectric conversion section 2), 5 degrees (F5.6), 10 degrees (F2.8). In addition, in Table 1, the light focusing rate of the solid-state image capturing device 20A is defined to be 100 percent in a case of 0 degrees incident light.

| | comparative table for light focusing rate (100 per cent in a case of 0 degrees incident light) | |
|---|---|---|
| incident light | structure of the present invention (inner-layer lens:multilayered structure) | conventional structure (inner-layer lens: SiN single layer) |
| 0° | 100% | 98% |
| 5° (F5.6) | 97% | 94% |
| 10° (F2.8) | 90% | 80% |

As illustrated in Table 1, the light focusing rate is 100 percent in the solid-state image capturing device 20A according to Embodiment 1 when the incident angle is at 0 degrees, whereas the light focusing rate is 98 percent for the conventional solid-state image capturing device. In addition, when the incident angle is at 5 degrees, the light focusing rate is 97 percent for the solid-state image capturing device 20A according to Embodiment 1, whereas the light focusing rate is 94 percent for the conventional solid-state image capturing device. Further, when the incident angle is at 10 degrees, the light focusing rate is 90 percent for the solid-state image capturing device 20A according to Embodiment 1, whereas the light focusing rate is 80 percent for the conventional solid-state image capturing device. It can be understood, as illustrated in Table 1, that the solid-state image capturing device 20A according to Embodiment 1 has greater light focusing rates than the conventional solid-state image capturing device at any incident angles in the comparison result of the light focusing simulation.

As described above, the light with particularly large incident angle can be effectively focused on the photoelectric conversion section 2 by changing the refractive index of the inner-layer lens 11A and increasing the refractive index as it gets far away from the photoelectric conversion section 2.

Therefore, according to Embodiment 1, the photoelectric conversion section 2 formed on the semiconductor substrate 1, the first transparent film 10 provided above the photoelectric conversion section 2, and the inner-layer lens 11A provided at the position on the first transparent film 10 corresponding to the photoelectric conversion section 2, are provided; and the inner-layer lens 11A is formed of the second transparent film, which is layered by changing the refractive index successively or incrementally in the film, and the bottom surface of the second transparent film is formed in a downwards convex shape. As a result, the light focusing rate of the microlens and the inner-layer lens can be improved in accordance with the required performance of the device.

Embodiment 2

While the case where the downward convex inner-layer lens 11A is formed using a concave shaped well (difference in level) between the photoelectric conversion section 2, and the transfer electrode 7 and light shielding film 9 has been described in Embodiment 1, a case where an upwards convex inner-layer lens is formed by transfer printing will be described in Embodiment 2.

Figure 3:
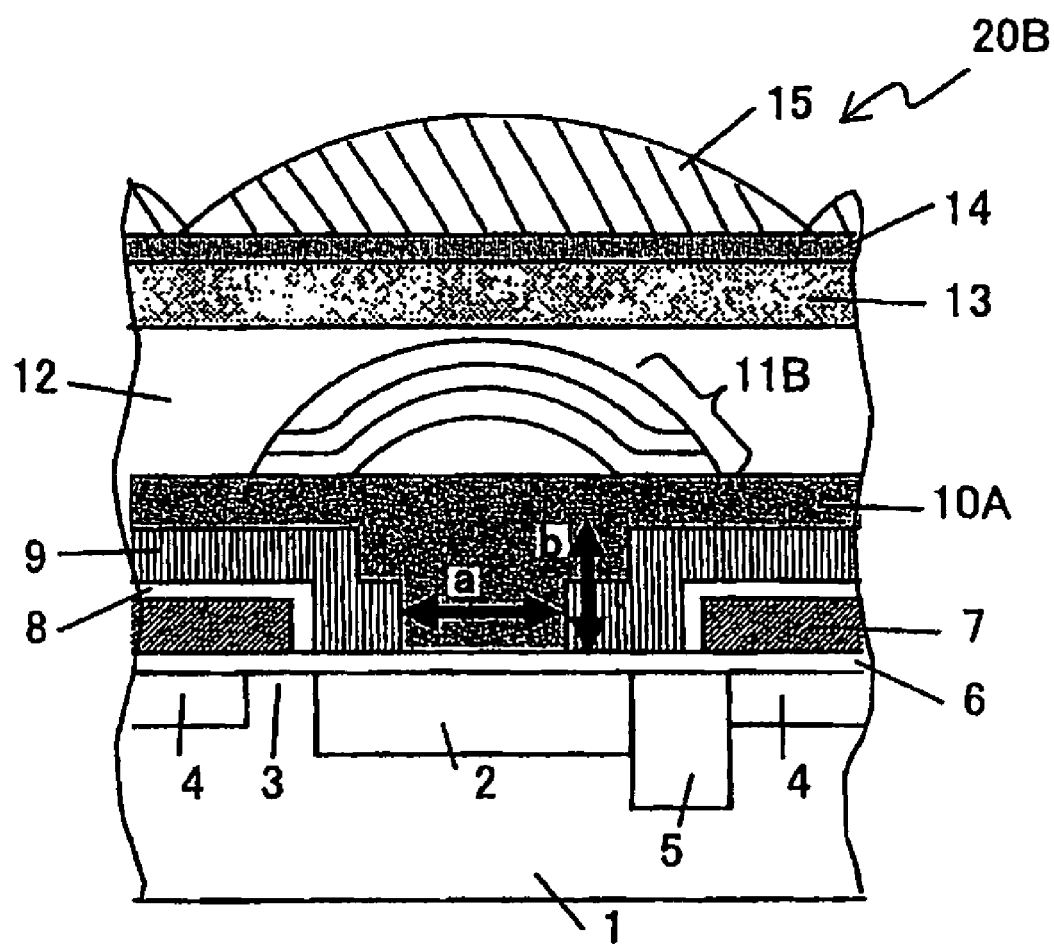
FIG. 3 is a longitudinal cross sectional view schematically illustrating an exemplary essential structure of one pixel of a solid-state image capturing device according to Embodiment 2 of the present invention.

FIG. 3 is a longitudinal cross sectional view schematically illustrating an exemplary essential structure of one pixel of a CCD type solid-state image capturing device according to Embodiment 2 of the present invention. In FIG. 3, the same reference numbers are used, for the description of the constituent members, as those of FIG. 1, since they have the same function and effect.

As illustrated in FIG. 3, a CCD type solid-state image capturing device 20B according to Embodiment 2 is provided with impurity diffusion layers, such as a photoelectric conversion section 2, a readout gate section 3 next to it, a CCD transfer channel 4 next to it, and a channel stopper 5 next to it, for each unit pixel in a surface side of a semiconductor substrate 1. A transfer electrode 7 is formed above the readout gate section 3 and the CCD transfer channel 4 with an insulation film 6 interposed therebetween. The transfer electrode 7 has a function to readout a signal charge from the photoelectric conversion section 2 (light receiving section) to the CCD transfer channel 4, besides a function to transfer an electric charge in a predetermined direction.

The photoelectric conversion section 2 includes, for example, a plurality of p-n junction diodes (photodiodes) formed in a matrix in the surface side of the semiconductor substrate 1, and a light that enters the photoelectric conversion section 2 is converted into a signal charge. The signal charge photoelectrically converted at the photoelectric conversion section 2 is supplied to the CCD transfer channel 4 provided on one side (left side in FIG. 3) of the photoelectric conversion section 2 via the readout gate section 3, and is finally transferred to an electric charge detection section (not shown) and detected as a voltage. The CCD transfer channel 4 provided on the other side (right side in FIG. 3) of the photoelectric conversion section 2 is separated from the photoelectric conversion section 2 by the channel stopper 5 provided between the photoelectric conversion section 2 and the CCD transfer channel 4 next to it.

A light shielding film 9 is provided above the transfer electrode 7 with an interlayer insulation film 8 interposed therebetween. The light shielding film 9 is provided for the purpose of preventing light from breaking through to the transfer section (CCD transfer channel 4), and an end section (outer circumference section) of the photoelectric conversion section 2 is also covered by the light shielding film 9. The light shielding film 9 has an opening that is optically opened above the photoelectric conversion section 2 except for the end section of the photoelectric conversion section 2.

On the light shielding film 9, a first planarization film 10A, which is made with BPSG film, is laminated as a first transparent film, and a plurality of layers of an upwardly convex inner-layer lens 11B, which is comprised of a high refractive index second transparent film, is formed thereabove, in such a manner to be positioned above the photoelectric conversion section 2.

The inner-layer lens 11B is constituted of a plurality of upwards convex layers (four layers herein) of the second transparent film, which are layered such that the refractive index is incrementally changed inside the film, in order to focus a light to the photoelectric conversion section 2, and at least either the bottom or top surface of the inner-layer lens 11B is formed in a convex shape (lens shape); however, a case with only the top surface being a convex shape is indicated herein. The plurality of upwards convex layers of the inner-layer lens 11B, which are constituted of the second transparent film, are formed such that the refractive index inside the film is incrementally increased within the range of 1.4 to 2.2 from the bottom surface to the top surface.

A second planarization film 12 is provided as a third transparent film for planarizing a surface in such a manner to cover the inner-layer lens 11B. Further, a microlens 15 is provided above the second planarization film 12 in such a manner to be positioned above the photoelectric conversion section 2 and the inner-layer lens 11B, with a color filter 13, in which three primary colors of red (R), green (G) and blue (B) are combined and arranged, and a protection film 14 thereon, which is constituted of a transparent organic film, interposed therebetween.

With the structure described above, the CCD type solid-state image capturing device 20B according to Embodiment 2 is configured, and the solid-state image capturing device 20B can be manufactured, for example, as follows.

FIGS. 4(a) to 4(f) are essential part longitudinal cross sectional views of one pixel for describing each of the manufacturing steps of the CCD type solid-state image capturing device 20B in FIG. 3.

Figure 4:
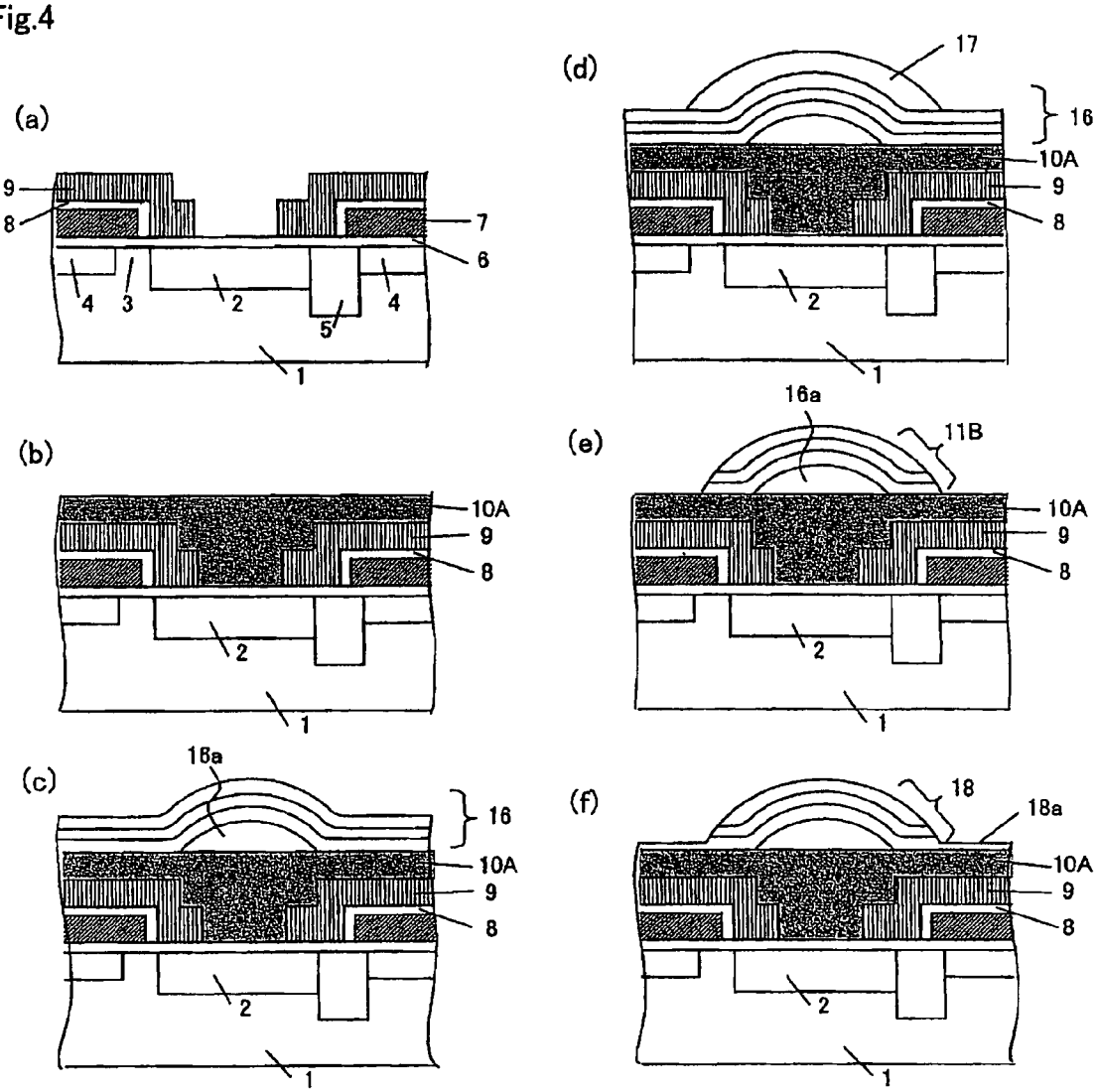
FIGS. 4(a) to (f) each are a longitudinal cross sectional view of one pixel for describing each of the manufacturing steps up to an inner-layer lens forming step of the solid-state image capturing device of FIG. 3.

First, as illustrated in FIG. 4(a), a predetermined impurity ion implantation is performed into the semiconductor substrate 1, and the photoelectric conversion section 2 (light receiving section), the readout gate section 3 next to it, the CCD transfer channel 4 (electric charge transfer section) next to it, and a channel stopper 5 next to it are respectively formed for each unit pixel.

Next, the insulation film 6 of the silicon oxide film and the like is formed by thermal oxidation on the surface side of the semiconductor substrate 1. A transfer electrode material constituted of polysilicon is layered on the insulation film 6, and subsequently, the transfer electrode 7 of a predetermined pattern is formed. Further, above the transfer electrode 7, the light shielding film 9 having an opening above the photoelectric conversion section 2 and covering the top surface and the end surface side of the transfer electrode 7, is formed with tungsten silicide, for example, with the interlayer insulation film 8 interposed therebetween.

Subsequently, as illustrated in FIG. 4(b), the BPSG film (film material of the first planarization film 10A) is accumulated up to a film thickness of 600 nm by the atmospheric pressure CVD method in such a manner to cover the light shielding film 9. In this case, a concave portion may be set above the photoelectric conversion section 2 as similar to Embodiment 1 by adjusting the concentration of the phosphor and boron contained in the BPSG film and the reflow temperature performed thereafter; however, a first planarization film 10A with a planarized surface is formed herein by setting the concentration of phosphor at 4.2 wt percent and the concentration of boron at 3.8 wt percent, and performing reflow at 950 degrees Celsius for twenty minutes.

Subsequently, as illustrated in FIG. 4(c), $SiO_2$ film with the maximum film thickness of 300 nm and the refractive index of 1.5 is formed on the first planarization film 10A by the CVD method at the reaction temperature of 450 degrees Celsius, using $O_2$ and $SiH_4$ as reaction gas, as an upwards convex lens shape portion 16a at the location corresponding to the photoelectric conversion section 2 (light receiving section). Further, successively, a SiON film (refractive index of 1.7) with a film thickness of 100 nm is formed on the first planarization film 10A and the lens shape portion 16a by adding $NH_3$ gas, by the amount of 40 percent of the $SiH_4$ gas, and by reducing 40 percent of the $O_2$ gas. Next, a SiON film (refractive index of 1.9) with a film thickness of 200 nm is formed thereon by adding $NH_3$ gas, by the amount of 80 percent of the $SiH_4$ gas, and by reducing 80 percent of the $O_2$ gas. Finally, a $Si_3N_4$ film with a film thickness of 200 nm and the refractive index of 2.0 is formed thereon using reaction gas in which a minute quantity of $O_2$ gas is added to $NH_3$ and $SiH_4$. As such, a plurality of layers (four layers herein) of the second transparent film 16 having an upwards convex and curved lens surface and a film thickness of 600 nm is layered.

As described above, the second transparent film 16 is layered such that the refractive index of the second transparent film 16 incrementally increases from the bottom surface (the surface of the photoelectric conversion section 2 side) to the top surface (the surface into which the light enters). Instead of the incremental increase, the second transparent film 16 can also be layered such that the refractive index of the second transparent film 16 successively increases from the bottom surface (the surface of the photoelectric conversion section 2 side) to the top surface (the surface into which the light enters).

Further, as similar to the conventional technique, a positive type photoresist is applied on the second transparent film 16 described above and a patterning is performed for a desired pattern. Subsequently, as illustrated in FIG. 4(d), reflow is performed at 160 degrees Celsius to form a resist pattern 17 for transferring the lens shape.

Further, as illustrated in FIG. 4(e), dry etching is performed under the condition with strong anisotropy to transfer the lens shape of the resist pattern 17 into the plurality of layers of the second transparent film 16, and the upwards convex inner-layer lens 11B is formed. In Embodiment 2, dry etching is performed, except for above the photoelectric conversion section 2, until the ground layer of the first planarization film 10A is exposed. However, it is also possible to stop the dry etching in the middle and form an inner-layer lens 18 in such a shape in which a planarization portion 18a remains at the lower most layer film on the first planarization film 10A, as illustrated in FIG. 4(f).

Further, in order to improve the light focusing rate of the inner-layer lens 11B, a second planarization film 12 with a low refractive index is formed in such a manner to cover the inner-layer lens 11B, and the surface of the film is planarized. Subsequently, a negative type resist, in which pigments having the spectral characteristics of red, green and blue are dispersed, is applied thereon and the resist is processed into a desired pattern by a photolithography technique called exposure developing to form the color filter 13. On the color filter 13, acrylic resin (e.g., thermosetting acrylic resin, OPTMER SS-1151: JSR Corporation) of the film thickness of 700 nm is applied to form a protection film 14. Subsequently, the microlens 15 is formed on the protection film 14 to manufacture the CCD type solid-state image capturing device 20B according to Embodiment 2, as illustrated in FIG. 3.

According to Embodiment 2 with the structure described above, the first planarization film 10A is formed above the semiconductor substrate 1 including the photoelectric conversion section 2 formed therein. On the first planarization film 10A, the plurality of layers of the upwards convex second transparent film, which has refractive index different from the refractive index of the first planarization film 10A, is layered in such a manner to gradually change the refractive index successively or incrementally in the film. Above the photoelectric conversion section 2, the second transparent film is formed by transferring with the top surface thereof as a convex portion, and the inner-layer lens 11B is formed. In this case, the refractive index of the inner-layer lens 11B is changeable within a predetermined range by adjusting the type, composition, flow rate of the reaction gas to be used, and further, the temperature and pressure at the layering, when formed by the CVD method, for example.

In Embodiment 2, as illustrated in FIG. 3, the top surface of the first planarization film 10A (first transparent film) is planarized and the top surface of the second transparent film 16 is processed and formed to transfer and form the upwards convex shaped inner-layer lens 11B. However, as illustrated in FIG. 5, it is possible to form a concave portion on the top surface of the planarized first planarization film 10A above the photoelectric conversion section 2 to define it as a first planarization film 10B, and form a convex portion on the bottom surface of the second transparent film 16 to form a downwards convex inner-layer lens 19.

As such, when the downwards convex inner-layer lens 19 is formed, it is not limited to form the first planarization film 10B in such a manner to form a lens-shaped concave portion on the top surface of the planarized first planarization film 10A above the photoelectric conversion section 2. When the downwards convex inner-layer lens 19 is formed, although the number of the steps will increase, it is also possible to planarize the top surface of the first planarization film 10A (first transparent film) and subsequently dig the first planarization film 10A from the top surface thereof in such a manner to have a concave portion corresponding to the downwards convex portion of the inner-layer lens 19 above the photoelectric conversion section 2 so as to film the inner-layer lens 19.

Figure 5:
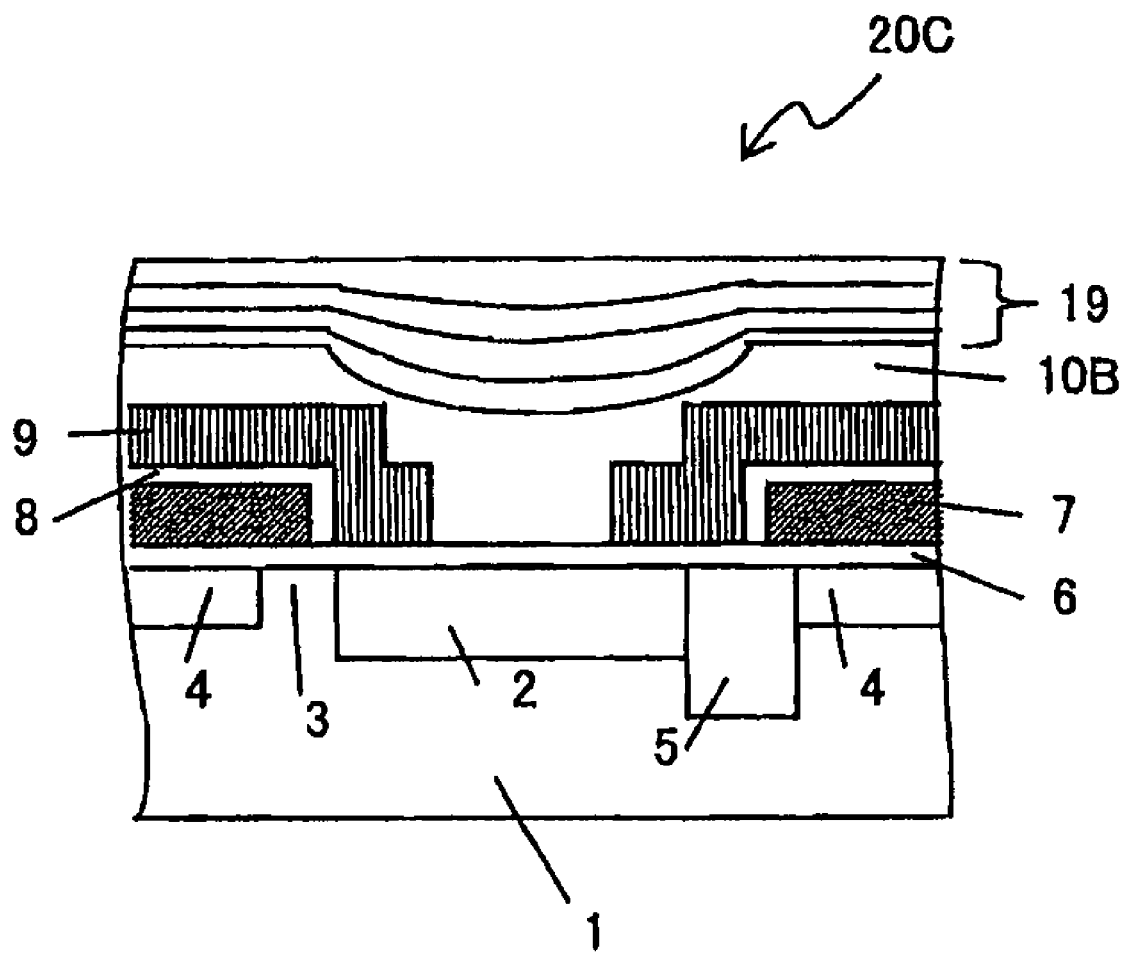
FIG. 5 is a cross sectional view schematically illustrating an exemplary essential structure of one pixel of a solid-state image capturing device, which is another exemplary variation of the solid-state image capturing apparatus of the present invention.

In addition, as illustrated in FIG. 5, when the inner-layer lens 19, which has a convex shape downwards only, is formed as a CCD type solid-state image capturing device 20C, since there is no convex shape on the inner-layer lens 19 and it is planarized, the thick planarization layer thereon will be unnecessary and the thickness of the CCD type solid-state image capturing device 20B in FIG. 3 can be much thinner. Therefore, it becomes possible to improve the sensitivity and decrease the size compared to the CCD type solid-state image capturing device 20B. Subsequently, on the inner-layer lens 19, the color filter 13, the protection film 14 and further the microlens 15 can be formed.

Figure 6:
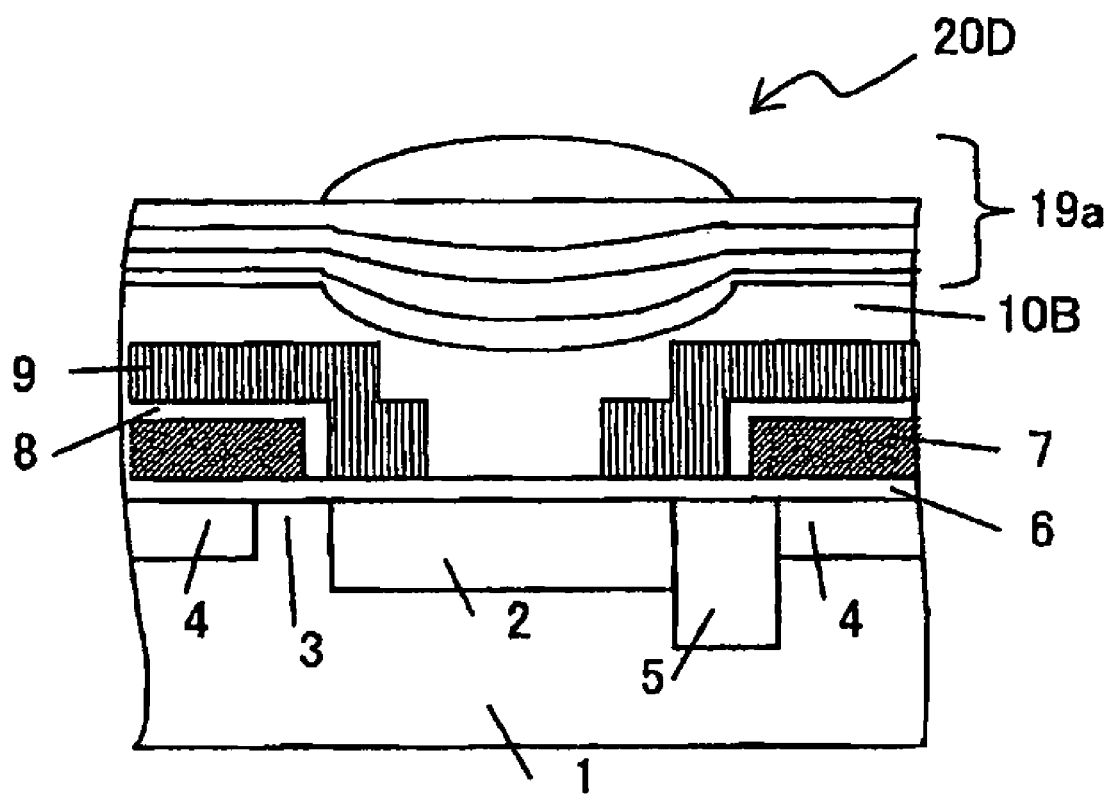
FIG. 6 is a cross sectional view schematically illustrating an essential structure of one pixel of a solid-state image capturing device, which is another exemplary variation of FIG. 5.

In addition, as a variation of the CCD type solid-state image capturing device 20C illustrated in FIG. 5 (CCD type solid-state image capturing device 20D), the following is also possible as illustrated in FIG. 6. A lens shaped concave portion is formed on the top surface of the planarized planarization film 10A above the photoelectric conversion section 2, and the first planarization film 10B is defined. A convex portion is formed on the bottom surface of the second transparent film to form the inner-layer lens 19 and the top surface of the second transparent film is processed and formed, and an upwards convex lens is added to form a inner-layer lens 19a.

As such, when the inner-layer lens 19a having a convex shape on both of the top and bottom surfaces of the second transparent film, the refractive index of the inner-layer lens 19a is changed either successively or incrementally in a certain range entirely along the bottom surface to the top surface of the inner-layer lens 19a. In addition, it is also possible to change the refractive index of the inner-layer lens 19a only on the bottom surface side of the inner-layer lens 19a, either successively or incrementally in a certain range, and the refractive index of the top surface side (upwards convex portion) of the inner-layer lens 19a is uniform. It is also possible for the top surface side to have the same refractive index with the same material as the upper most layer (downwards convex upper-most layer) on the bottom surface side of the inner-layer lens 19a. In addition, it is also possible to set the refractive index of the bottom surface side (downwards convex portion) of the inner-layer lens 19a constant, and change the refractive index of only the top surface side (upwards convex portion) of the inner-layer lens 19a either successively or incrementally in a certain range so that light can be focused preferably onto the photoelectric conversion section 2.

Similar to this, when the upwards convex inner-layer lens 11B is formed as illustrated in FIG. 3 or the downwards convex inner-layer lens 19 is formed as illustrated in FIG. 5, it is also possible to change the refractive index of at least a portion of the inner-layer lens 11B (or inner-layer lens 19) either successively or incrementally in a certain range and leave the rest of the portion with a uniform refractive index, so as to preferably focus light onto the photoelectric conversion section 2.

In short, the refractive index may be changed either successively or incrementally in a certain range at all or part of the inner-layer lens, such as the inner-layer lenses 11A, 11B, 19 and 19a, so as to preferably focus light onto the photoelectric conversion section 2.

Further, it has been described in Embodiments 1 and 2 that the microlens 15 is provided to be positioned above the photoelectric conversion section 2 and the inner-layer lens 11A or 11B; however, without the limitation to this, there is also a case where the microlens 15 is not provided.

In addition, it has been described in Embodiments 1 and 2 that the refractive index of the second transparent film 10 or 10A increases either successively or incrementally in a certain range from the bottom surface to the top surface of the photoelectric conversion section 2 side; however, without the limitation to this, it is also possible to form the second transparent film such that the refractive index decreases either successively or incrementally in a certain range from the bottom surface to the top surface of the photoelectric conversion section 2 side.

In addition, the case where the CCD type solid-state image capturing device is applied to the present invention, other solid-state image capturing device, such as a CMOS type solid-state image capturing device, can be applied to the present invention; and similar to the cases of Embodiments 1 and 2, a semiconductor element having a desired shape of an inner-layer lens or microlens can be obtained by appropriately adjusting the thickness and the forming conditions of the inner-layer lens, planarization film, protection film and microlens. In addition, it is possible to configure the microlens 15 in such a manner to form it by using the second transparent film that is layered by changing the refractive index successively or incrementally, together with or separately from the inner-layer lens 11A, 11B, 11C or 11D.

Embodiment 3

Figure 7:
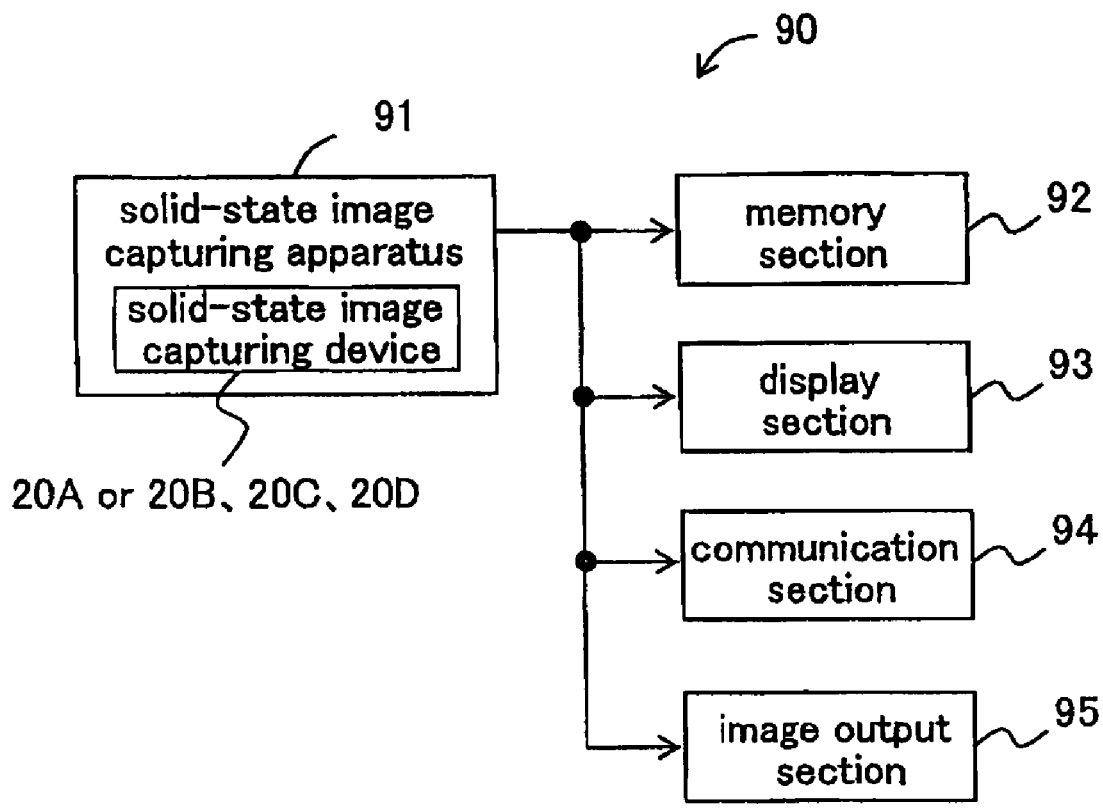
FIG. 7 is a block diagram illustrating an exemplary diagrammatic structure of an electronic information device as Embodiment 3 of the present invention, including the solid-state image capturing device according to Embodiment 1 or 2 of the present invention used in an image capturing section.
Figure 8:
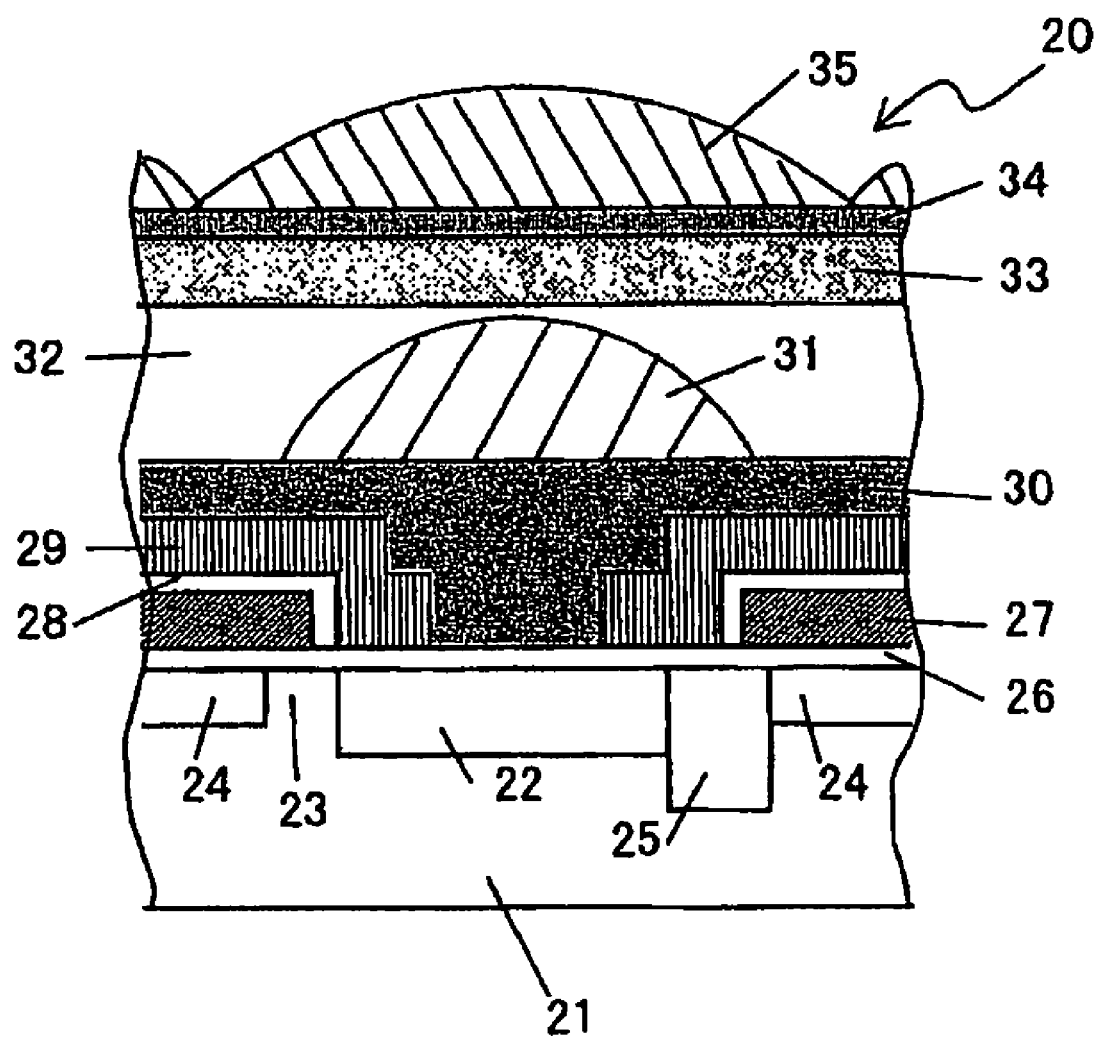
FIG. 8 is a longitudinal cross sectional view schematically illustrating an exemplary essential structure of one pixel of a conventional CCD type solid-state image capturing device disclosed in Reference 2.
Figure 9:
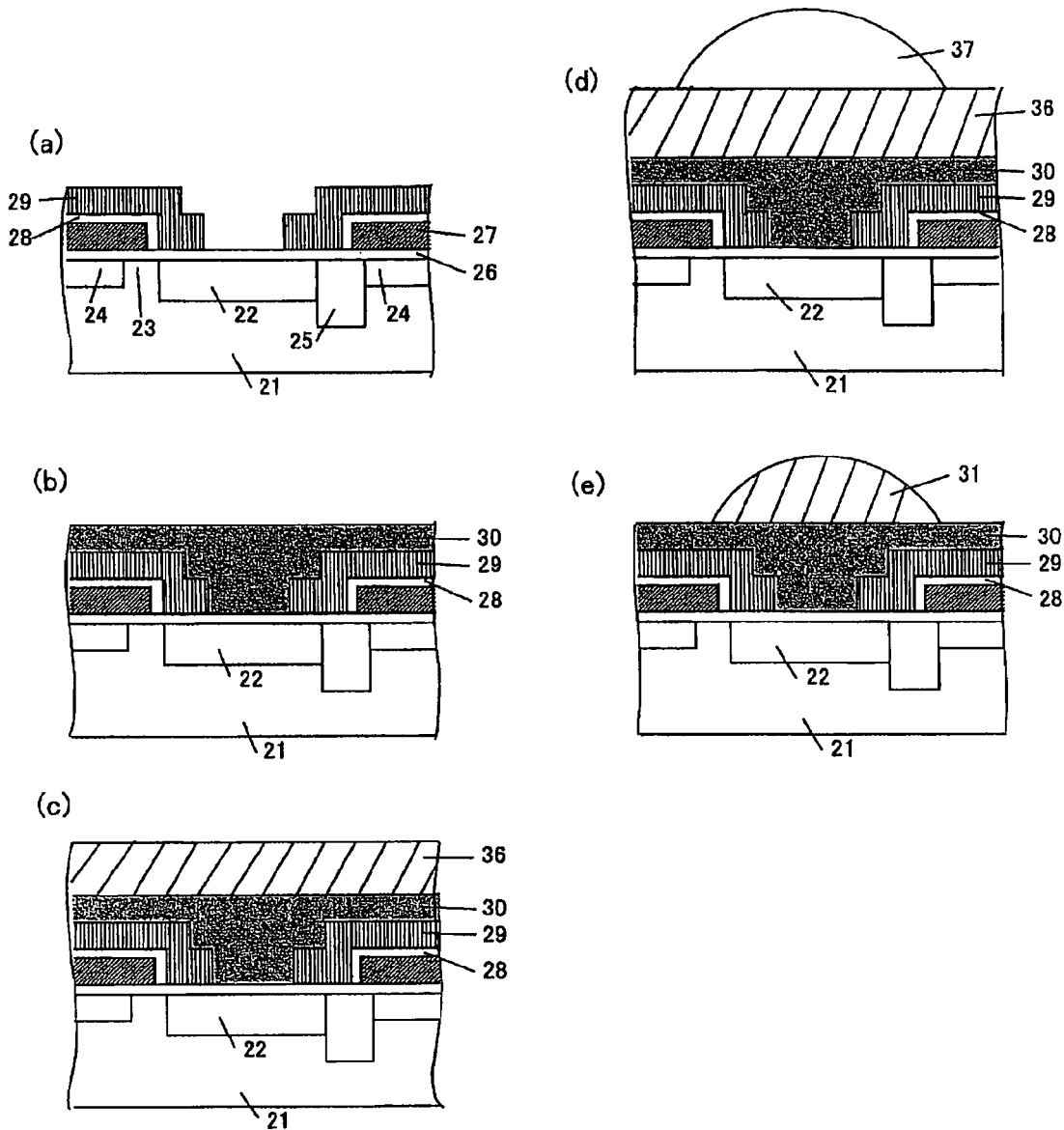
FIGS. 9(a) to (e) each are an essential part longitudinal cross sectional view for describing each of the manufacturing steps up to an inner-layer lens forming step of the conventional solid-state image capturing device of FIG. 8.

FIG. 7 is a block diagram illustrating an exemplary diagrammatic structure of an electronic information device as Embodiment 3 of the present invention, including the solid-state image capturing device according to Embodiment 1 or 2 of the present invention used in an image capturing section.

In FIG. 7, the electronic information device 90 according to Embodiment 3 of the present invention includes: a solid-state image capturing apparatus 91 for performing various signal processing on an image capturing signal from the solid-state image capturing devices 20A, 20B, 20C or 20D according to Embodiments 1 and 2 described above so as to obtain a color image signal; a memory section 92 (e.g., recording media) for data-recording a color image signal from the solid-state image capturing apparatus 91 after a predetermined signal process is performed on the color image signal for recording; a display section 93 (e.g., a color liquid crystal display apparatus) for displaying the color image signal from the solid-state image capturing apparatus 91 on a display screen (e.g., liquid crystal display screen) after predetermined signal processing is performed on the color image signal for display; a communication section 94 (e.g., a transmitting and receiving device) for communicating the color image signal from the solid-state image capturing apparatus 91 after predetermined signal processing is performed on the image signal for communication; and an image output section 95, such as a printer, for printing the color image signal from the solid-state image capturing apparatus 91 after predetermined signal processing is performed on the color image signal for printing. Without any limitations to this, the electronic information device 90 may include any of the memory section 92, the display section 93, the communication section 94, and the image output section 95.

As the electronic information device 90, an electronic device that includes an image input device is conceivable, such as a digital camera (e.g., digital video camera and digital still camera), an image input camera (e.g., a monitoring camera, a door phone camera, a camera equipped in a vehicle, and a television telephone camera), a scanner device, a facsimile machine, a camera-equipped cell phone device and a portable digital assistant (PDA).

Therefore, according to Embodiment 3 of the present invention, the color image signal from the sensor module 91 can be: displayed on a display screen finely; printed out finely on a sheet of paper using an image output section 95; communicated finely as communication data via a wire or a radio; stored finely at the memory section 92 by performing predetermined data compression processing; and further various data processes can be finely performed.

As described above, the present invention is exemplified by the use of its preferred Embodiments 1 to 3. However, the present invention should not be interpreted solely based on Embodiments 1 to 3 described above. It is understood that the scope of the present invention should be interpreted solely based on the claims. It is also understood that those skilled in the art can implement equivalent scope of technology, based on the description of the present invention and common knowledge from the description of the detailed preferred Embodiments 1 to 3 of the present invention. Furthermore, it is understood that any patent, any patent application and any references cited in the present specification should be incorporated by reference in the present specification in the same manner as the contents are specifically described therein.

INDUSTRIAL APPLICABILITY

The present invention can be applied in the field of a solid-state image capturing device comprising semiconductor elements for performing a photoelectric conversion on and capturing an image light from an object, a method for manufacturing the solid-state image capturing element, and an electronic information device, such as a digital camera (e.g., digital video camera and digital still camera), an image input camera, a scanner device, a digital copying machine, a facsimile machine and a camera-equipped cell phone device, having the solid-state image capturing device as an image input device used in an image capturing section of the electronic information device; and it is possible to improve the light focusing rate of the microlens and the inner-layer in accordance with the required performance of the device.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A solid-state image capturing device comprising: a photoelectrical conversion section formed in a semiconductor substrate or in a substrate area provided on a substrate; a first transparent film provided above the photoelectrical conversion section; and a lens provided at a position above the first transparent film corresponding to the photoelectrical conversion section, wherein the lens is formed by using a second transparent film layered by changing a refractive index successively or incrementally, a top surface of the second transparent film is formed in an upwardly convex shape in an area above the photoelectrical conversion section, a bottom surface of the second transparent film is formed in a downwardly convex shape, and the lens is formed continuously with a plurality of layers, and wherein a top layer of the plurality of layers includes the upwardly convex top surface, the top layer of the plurality of layers does not extend across an entire layer underneath the top layer, and the entire layer underneath the top layer is a layer of the plurality of layers and is adjacent to the top layer, wherein the second transparent film is formed by controlling a chemical composition like silicon oxide, silicon oxynitride and silicon nitride to change a refractive index inside the film successively or incrementally.

2. A solid-state image capturing device according to claim 1, wherein the second transparent film is at least either of a metal compound and a silicon compound.

3. A solid-state image capturing device according to claim 1, wherein the second transparent film is formed such that the refractive index either increases or decreases successively or incrementally from a bottom surface to a top surface of the photoelectrical conversion section side.

4. A solid-state image capturing device according to claim 1, wherein the refractive index of the second transparent film is changed within the range of 1.4 to 2.2.

5. A solid-state image capturing device according to claim 1, wherein the first transparent film includes a concave portion on the top surface thereof, which is due to a concave portion above the photoelectrical conversion section, and the second transparent film is embedded into the concave portion of the top surface as the lens and the bottom surface of the second transparent film is formed downwardly convex.

6. A solid-state image capturing device according to claim 1,
wherein a gate electrode for transferring a signal charge from the photoelectrical conversion section is provided on the semiconductor area provided on the semiconductor substrate or the substrate in which the photoelectrical conversion section is formed;
wherein a concave portion is formed in the first transparent film above the photoelectrical conversion section, due to a difference in level between the gate electrode and the photoelectrical conversion section; and
wherein the second transparent film is embedded into the concave portion of the first transparent film as the lens and the bottom surface of the second transparent film is formed downwardly convex.

7. A solid-state image capturing device according to claim 1, wherein the second transparent film is layered by changing the refractive index successively or incrementally inside the film together with the convex portion, and an upwardly convex lens is formed on a position on the first transparent film corresponding to the photoelectrical conversion section.

8. A solid-state image capturing device according to claim 1, wherein a third transparent film, which has a refractive index lower than that of the second transparent film, is formed on the second transparent film.

9. A solid-state image capturing device according to claim 8, wherein another lens, which is different from the lens, is formed above the third transparent film in such a manner to correspond to the photoelectrical conversion section.

10. A solid-state image capturing device according to claim 9, wherein a color filter and a protection film are formed between the third transparent film and the another lens.

11. A solid-state image capturing device according to claim 1, wherein the second transparent film is set to have a refractive index higher than that of the first transparent film.

12. A solid-state image capturing device according to claim 1, wherein the lens is an inner-layer lens.

13. A solid-state image capturing device according to claim 1, wherein the solid-state image capturing device is a CCD solid-state image capturing device or a CMOS solid-state image capturing device.

14. An electronic information device including the solid-state image capturing device according to claim 1 as an image input device in an image capturing section.

* * * * *